United States Patent [19]

Tatosian et al.

[11] Patent Number: 5,357,529
[45] Date of Patent: Oct. 18, 1994

[54] ERROR DETECTING AND CORRECTING APPARATUS AND METHOD WITH TRANSPARENT TEST MODE

[75] Inventors: David A. Tatosian, Stow; Donald W. Smelser, Bolton; Paul M. Goodwin, Littleton, all of Mass.

[73] Assignee: Digital Equipment Corporation, Maynard, Mass.

[21] Appl. No.: 872,977

[22] Filed: Apr. 24, 1992

[51] Int. Cl.$^5$ .......................................... H03M 13/00
[52] U.S. Cl. ................................................. 371/40.1
[58] Field of Search .................... 371/40.1, 37.6, 40.4, 371/21.1, 51.1, 48, 67.1; 365/201; 395/425

[56] References Cited

U.S. PATENT DOCUMENTS

| | | | |
|---|---|---|---|
| 4,384,348 | 5/1983 | Nozaki | 365/201 |
| 4,604,750 | 8/1986 | Manton et al. | 371/38 |
| 4,617,664 | 10/1986 | Aichelmann, Jr. et al. | 371/38 |
| 4,782,486 | 11/1988 | Lipcon et al. | 371/21 |

*Primary Examiner*—Charles E. Atkinson
*Assistant Examiner*—Phung M. Chung
*Attorney, Agent, or Firm*—Arnold, White & Durkee

[57] ABSTRACT

System for testing memory associated with a set of check bits in an EDC system. The circuitry of the invention includes an EDC circuit; multiplexers; and a memory with first storage bits, second storage bits, and third storage bits. In writing data to the memory, a multi-bit data word having a first group of data bits and a second group of data bits is first received from a CPU bus. The first group of bits is written to the first storage bits. In a "normal" mode, the second group of bits is written to the second storage bits. A set of check bits are calculated by the EDC circuit and written to the third storage bits. In the "swap" mode, the second group of data bits is stored in the third storage bits. "Alternate" bits are calculated by the EDC circuit, and written to the second storage bits. In memory reads, contents of all of the storage bits are received from the memory and directed to the error detecting circuit. The contents of the first storage bits are directed to error correction circuit. In the normal mode, the contents of the second storage bits are directed to the error correction circuit; this data is corrected if necessary, and placed on the CPU bus. In the swap mode, the contents of the third storage bits are supplied to the error correcting circuit and, along with the contents of the first storage bits, placed on the CPU bus without error correction.

13 Claims, 3 Drawing Sheets

ERROR DETECTING AND CORRECTING APPARATUS AND METHOD WITH TRANSPARENT TEST MODE

BACKGROUND OF INVENTION

1. Field of Invention

The present invention relates to a computer having error correction and detection (EDC) circuitry. More particularly, the invention relates to an apparatus and method for testing memory storage bits associated with check bits, without interfering with the operation of EDC circuitry.

2. Description of Related Art

EDC circuitry helps computers operate with increased accuracy and efficiency, and may even prevent certain computer malfunctions. Accordingly, EDC circuitry has become an integral part of today's computers.

A typical system that utilizes EDC is shown in FIG. 1. In a typical write operation, the EDC circuitry 100 receives input data from a central processing unit (CPU) bus 102. The data on the bus 102 comprises a multi-bit data word. Based upon the data word, the EDC circuitry 100 calculates a set of check bits. The check bits are calculated using one of a variety of checking routines, many of which are well known in the art.

In a write operation of a typical computer, the EDC circuitry 100 writes the data word bits to a random access memory 104, via a data bus 106. Likewise, the EDC circuitry 100 writes the set of check bits to the memory 104, via a check bus 108. Each address of the memory 104 is shown in FIG. 1 as a horizontal row. For each address of the memory 104, the storage bits in which the data word bits can be written are designated as 110; the storage bits in which the check bits can be written are designated as 112. The address in which the data word bits and the check bits are stored is designated by an address input, received by the memory 104 via an address bus 114.

In a typical read operation, the EDC circuitry receives the data word bits from the memory 104, and supplies these bits to the CPU bus 102. More specifically, in a single read operation, the EDC circuitry 100 receives the data word bits from the storage bits 110, via the data bus 106. Additionally, the EDC circuitry receives the set of check bits from the storage bits 112, via the check bus 108.

Various testing schemes have been used to indirectly test the memory 104. One scheme involves directly testing the memory 104 by writing user-selected data to the memory 104, and reading the data from the memory 104 to determine whether the memory 104 properly stored the data. The test can be easily performed for the storage bits 110, by simply instructing the CPU (not shown) to supply the EDC circuitry 100 with the desired data word bits. However, it is more difficult to test the storage bits 112, since it is troublesome to write user-selected check bits to the memory 104.

One method used to test the storage bits 112 uses "diagnostic and visibility" registers (not shown) that are embedded within EDC control logic of some models of computers. Testing the storage bits 112 involves a number of steps. First, the desired check bits are written into a particular diagnostic register, and a diagnostic write operation is performed, which writes the contents of the diagnostic register into the storage bits 112. Next, a read operation is performed, which places the contents of the storage bits 112 into the diagnostic register. Then, the contents of the diagnostic register are compared to the check bits that were originally written into the diagnostic register. Although this method accomplishes the result of testing the storage bits 112, it is still considered inadequate in some applications. Specifically, since the steps outlined above occupy the central processor for some period of time, the overall operation of the computer is slowed. Furthermore, during the diagnostic test, the error detecting and correcting circuitry 100 is effectively disabled.

An alternative method that been used to test the storage bits 112 involves calculating the data word bits which, when input into the EDC circuitry 100, produce a pattern of check bits that is designed to test the storage bits 112. When the calculated data word bits are placed on the CPU bus 102, the EDC circuitry 100 generates the desired pattern of check bits and writes them into the storage bits 112. Then, the data word and the generated check bits are read from the memory 104 by the EDC circuitry 100. The EDC circuitry 100 then uses the check bits to identify perceived errors in the data word. Such identified errors are then corrected. Thus, if the check bits are stored improperly, when the EDC circuitry 100 uses the erroneous check bits to identify any errors in the data word, the EDC circuitry 100 will improperly determine that the data word is erroneous; accordingly, the EDC circuitry 100 will modify the data word in accordance with the erroneous check bits. Thus, it is implied that if the EDC circuitry 100 supplies the CPU bus 102 with the same data word that was originally received from the CPU bus 102, the data word and the check bits were properly written to and read from the memory 104. Although this approach might be satisfactory for some purposes, many have found it to be inadequate. Particularly, calculating the required data word typically involves lengthy, laborious, and time-consuming operations. These operations are difficult since they must effectively accomplish the reverse process of the EDC circuitry 100 by calculating a data word based upon the desired check bits. Furthermore, this approach is limited since, if a memory error does occur, it is difficult to tell whether the error was associated with the data word, i.e. the storage bits 110, or the check bits, i.e. the storage bits 112.

Accordingly, a system is needed to directly test the check bits 112 of the memory 104. Furthermore, it would be beneficial if such a system did not introduce any delays into read operations of the computer.

BRIEF SUMMARY OF INVENTION

The present invention is directed at the problems described above. In a general aspect, the invention comprises a system for testing or verifying memory associated with a computer. The invention, more particularly, comprises a system for testing the storage bits of memory associated with data word bits and check bits of a code word in a computer equipped with an EDC system.

The invention is capable of operating in a "normal" mode and in a "swap" mode. In the normal mode of operation, a multi-bit data word is received from a CPU bus and written to a first group of storage bits in the memory. Concomitantly, the EDC circuitry calculates a number of check bits based on the data word bits, and these "normal" check bits are written to a second group of storage bits in the memory. The data word bits and the check bits, taken together, form a code word which may be referred to as a "valid" code word.

In the "normal" mode, when the data word and the check bits are read from the memory to the EDC circuitry, the EDC circuitry recognizes whether the code word is valid by determining whether the data word corresponds to the check bits. If the code word is not valid, the EDC circuitry corrects the data word, and the corrected data word is placed on the CPU bus.

In the "swap" mode, a first group of the data word bits are written to their normal storage bits in the memory. However, a second group of the data word bits, equal in number to the check bits, are written to the storage bits normally occupied by the check bits. Concomitantly, a set of "alternate" bits, also equal in number to the check bits, is written to the storage bits normally occupied by the second group of the data word bits. The "alternate" bits are generated or otherwise selected, such that the first group of the data word bits and the alternate bits form a data word which, when considered with the second group of the data bits, forms a valid code word. Thus, the alternate bits are preferably selected such that if check bits were to be calculated based on the first group of the data word bits and the alternate bits, such check bits would match the second group of the data word bits.

When data is read in the "swap" mode, the EDC circuitry determines whether the first group of the data bits, the alternate bits, and the second group of the data word bits form a valid code word. If the code word is not valid, the EDC provides a signal indicative of the error. After the data has been read from the memory and any errors have been detected, the first and second groups of the data word bits are placed on the CPU bus. Accordingly, erroneous storage bits in the memory can be identified by determining whether any bits of the data word that was read from the memory and placed on the CPU bus do not match the corresponding bits of the data word originally received from the CPU bus.

In an apparatus aspect, the system of the invention comprises a memory, EDC circuitry, a CPU, a check bit generator, an alternate bit generator, and multiplexing or other suitable switching means capable of routing digital values (signals) in preselected parts to and from the memory. More particularly, the memory is capable of receiving and storing at a given address a multi-bit data word including first and second groups of bits and a number of check bits generated by the check bit generator based on the data word. The switching means, which typically may comprise a number of multiplexers, is capable in a first mode or configuration of (1) writing the normal data words and their normal check bits to their respective positions in the memory; and (2) recalling from and transmitting the stored bits to the EDC circuitry for error detection and possible correction of the data word for further transmission to a CPU bus or other destination. In a second mode or configuration, the switching means is operable to (1) write the first group of bits to its normal storage position, the second group of bits to the storage position normally occupied by check bits, and a set of alternate bits to the storage position normally occupied by the second group of bits; and (2) to recall and transmit the first and second groups of bits and the set of alternate bits to the EDC circuitry for error detection; and transmit the first and second groups of bits to the CPU bus or another destination.

DESCRIPTION OF DRAWINGS

The exact nature of the invention, as well as other objects and advantages thereof, will become apparent to those skilled in the art after consideration of the following detailed description in connection with the accompanying drawings, in which like reference numerals designate like parts throughout, wherein.

DESCRIPTION OF A PREFERRED EMBODIMENT

Figure 1:
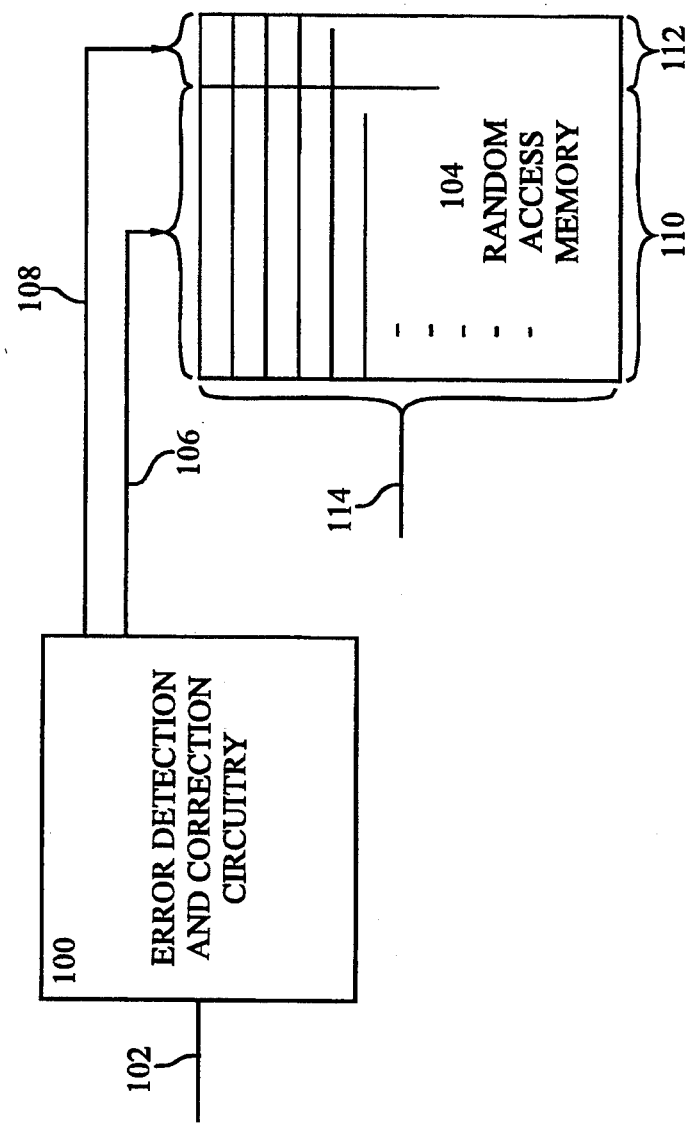
FIG. 1 is a diagram showing a typical EDC arrangement in a computer.
Figure 2:
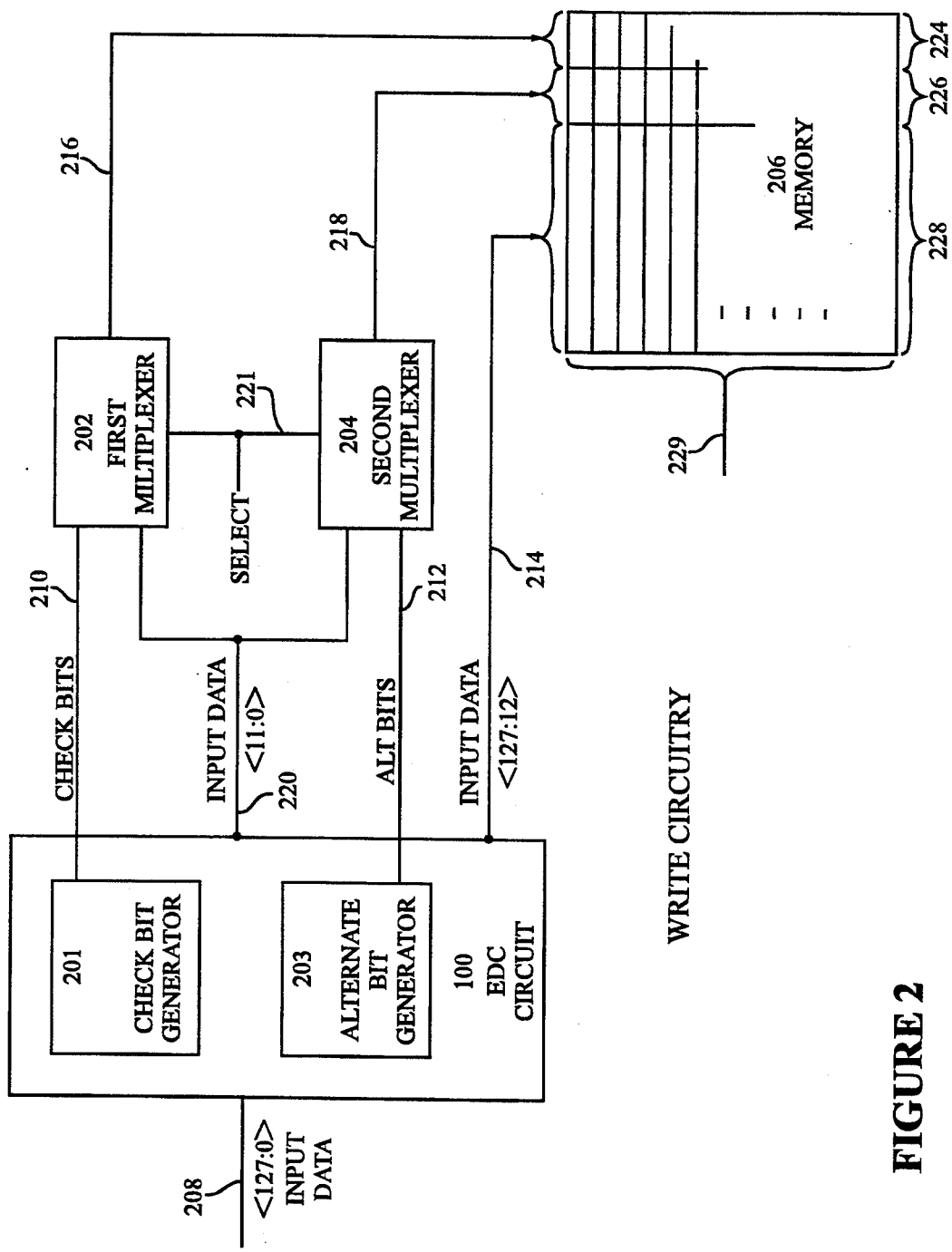
FIG. 2 is a diagram showing the EDC arrangement and the write circuitry of the present invention.
Figure 3:
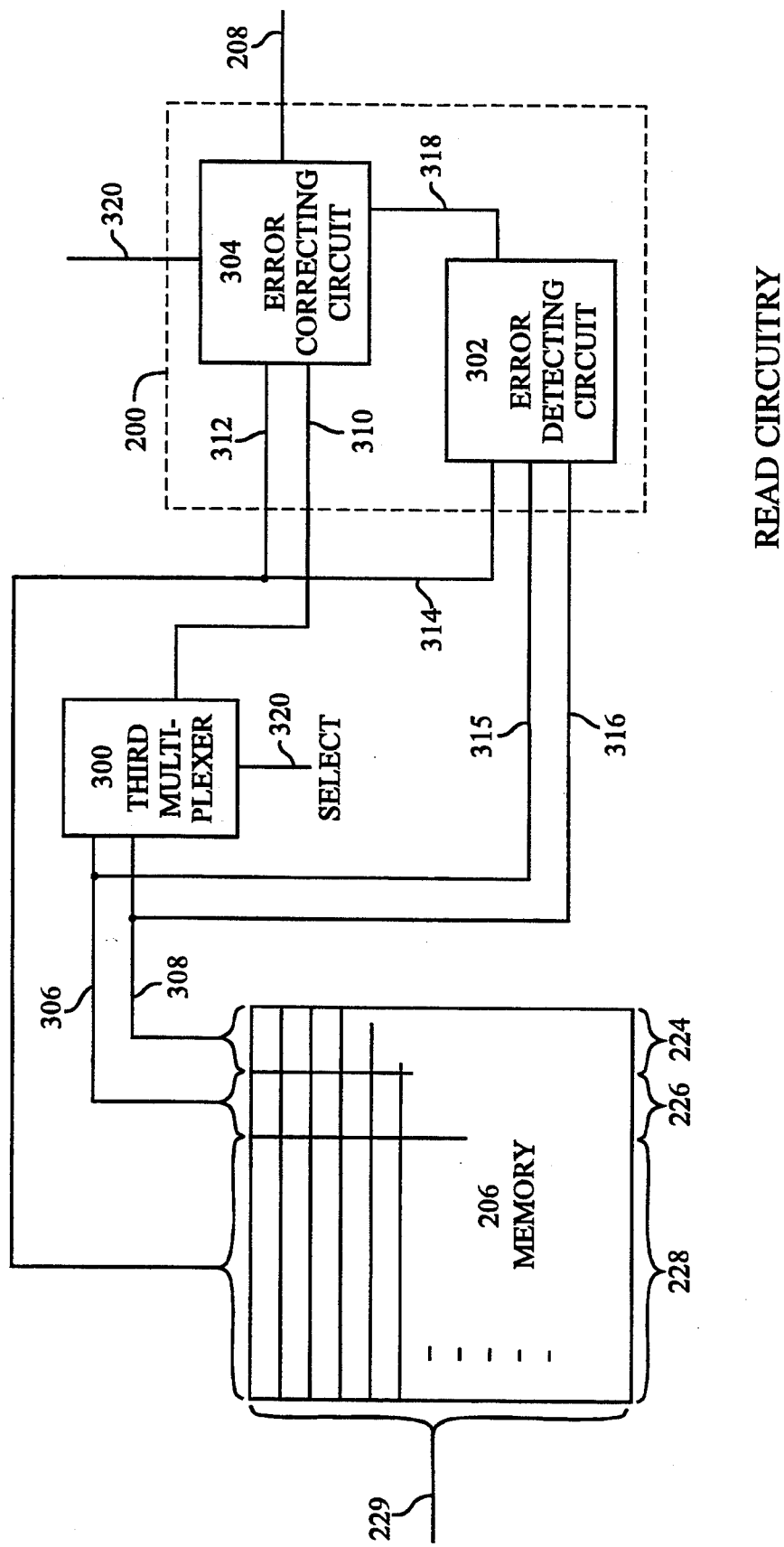
FIG. 3 is a diagram showing the EDC arrangement and the read circuitry of the present invention.

Referring to the drawings, a preferred embodiment of the invention will be described. As illustrated in FIGS. 2 and 3, the present invention comprises an apparatus for testing the storage bits of memory associated with the check bits of a code word in a computer having EDC circuitry. The invention includes write circuitry, shown in FIG. 2, and read circuitry, shown in FIG. 3. In the description below, items such as buses, words, storage bits of memory, and the like are given specific sizes, such as 12 or 128 bits; such features of the invention are not limited to the sizes shown, however, since these sizes are used only for explanatory purposes.

STRUCTURE

Write Circuitry

Referring to FIG. 2, the primary components of the write circuitry of the invention include an EDC circuit 200, a first multiplexer 202, a second multiplexer 204, and a memory 206. The EDC circuit 200 includes a check bit generator 201 and an alternate bit generator 203. The multiplexers 202 and 204 are 2:1 multiplexers. An ordinarily skilled artisan, having the benefit of this specification, would be able to select a proper model of multiplexer for the present application from the many 2:1 multiplexers that are currently available. In a preferred embodiment, the memory 206 comprises dynamic random access memory (DRAM). Although the memory 206 is shown as a single unit, it is understood that the memory 206 may include a plurality of memory units that each process one or more bits of data.

The EDC circuit 200 is electrically connected to a CPU bus 208. The EDC circuit 200 is electrically connected to the first multiplexer 202 via a bus 210; likewise the EDC circuit 200 is electrically connected to the second multiplexer 204 via a bus 212. A bus 220 electrically connects the EDC circuit 200 to both of the multiplexers 202, 204. Furthermore, the EDC circuit 200 is electrically connected to the memory 206 via a bus 214. The first and second multiplexers 202, 204 are electrically connected to the memory 206 via buses 216 and 218. The multiplexers are electrically connected to a common select input line 221. The memory 206 contains a plurality of storage bits, including storage bits 224 corresponding to the bus 216, storage bits 226 corresponding to the bus 218, and storage bits 228 corresponding to the bus 214. In FIG. 2, a single address of the memory 206 is indicated by a horizontal row. The memory 206 receives an address value via an address line 229, which specifies the address in which the bits contained on the buses 214, 216, and 218 will be stored.

Read Circuitry

Referring to FIG. 3, the primary components of the read circuitry of the invention include the memory 206, a third multiplexer 300, and the EDC circuit 200. The multiplexer 300 is a 2:1 multiplexer. The EDC circuit 200 includes an error detecting circuit 302 and an error correcting circuit 304.

The third multiplexer 300 is electrically connected to the memory 206 via buses 306 and 308, and to the error correcting circuit 304 via a bus 310. The memory 206 and the error correcting circuit 304 are electrically interconnected via a bus 312. The error detecting circuit 302 is electrically connected to the memory 206 via buses 314, 315, and 316, and to the error correcting circuit 304 via a bus 318. The error correcting circuit 304 is electrically connected to the CPU bus 208, and to a select input line 320. The multiplexer 300 is also electrically connected to the select input line 320.

OPERATION

General Description—Write Circuitry

Referring to FIG. 2, the write circuitry of the invention operates in one of two modes: a "normal" mode, or a "swap" mode, depending upon whether the select input line 221 contains a high or a low signal. In the normal mode, a multi-bit data word is received from the CPU bus 208 and written to the storage bits 226 and 228 of the memory 206. In the preferred embodiment, the data word includes 128 bits: a first group of data bits (i.e. bits 12-127) and a second group of data bits (i.e. bits 0-11). In addition, a set of check bits, calculated by the EDC circuit 200, are written to the storage bits 224 of the memory 206. A set of check bits, in the preferred embodiment, comprises 12 bits. The data word bits and the set of check bits associated with that data word constitute a valid "code word" if no errors are present therein.

In the "swap" mode, the first group of data bits (i.e. 12-127) are written to the storage bits 228 of the memory 206, as in the normal mode. However, the second group of data bits are directed into the storage bits 224. Additionally, a number of "alternate bits" are calculated by the EDC circuit 200, and written into the storage bits 226. As with the normal mode, the data stored in storage bits 228, 226, and 224 constitute a valid code word if no error is present therein; however, the storage bits 224 contain the second group of data bits (i.e. bits 0-11), and the storage bits 226 contain the alternate bits.

Detailed Description—Write Circuitry

The EDC circuit 200 receives the multi-bit data word from the CPU bus 208. This data comprises information that the computer (not shown) has sent for storage in the memory 206. In both normal and swap modes, a check bit generator 201 of the EDC circuit 200 calculates a set of check bits based upon the data word bits. In the preferred embodiment, the check bit generator 200 comprises a parity tree arrangement. The calculation of check bits using parity trees is sufficiently well known in the art that an ordinarily skilled artisan, equipped with this specification, would be able to design an arrangement of parity trees suitable for the check bit calculation required for the present invention. The set of check bits are provided to the first multiplexer 202 by the bus 210.

The first and second multiplexers 202,204 receive bits 0-11 of the data word from the bus 220. The multiplexers 202,204, also receive a signal from a "select" input line 221, which determines whether the write circuitry operates in the normal mode or the swap mode. The second multiplexer 204 also receives "alternate" bits, equal in number to the number of the check bits, by the bus 212. The alternate bits are calculated by an alternate bit generator 203 of the EDC circuit 200, as described below. Bits 12-127 of the data word are written directly to the memory 206 by the EDC circuit 200, via the bus 214.

The normal mode is selected by placing a low signal on the select input line 221 of the multiplexers 202, 204. When this occurs, the first multiplexer 202 directs the check bits to the storage bits 224; in addition, the second multiplexer 204 directs bits 0-11 of the data word to the storage bits 226. Bits 12-127 are written to the storage bits 228 via the bus 214. In this situation, the code word comprises the set of check bits 0-11 and bits 0-127 of the data word. The data written to the memory 206 are shown in Table I.

TABLE I

| Data Written to Memory in Normal Mode | |
|---|---|
| bits written to | data written |
| storage bits 224 | check bits, 0-11 |
| storage bits 226 | data word, bits 0-11 |
| storage bits 228 | data word, bits 12-127 |

The swap mode is selected by placing a high signal on the select input line 221 of the multiplexers 202, 204. When this occurs, the first multiplexer 202 writes bits 1-11 of the data word to the storage bits 224; the second multiplexer 204 writes the 12 alternate bits to the storage bits 226. In this situation, the code word comprises bits 1-11 of the data word, alternate bits 0-11, and bits 12-127 of the data word. The data written to the memory 206 are shown in Table II.

TABLE II

| Data Written to Memory in Swap Mode | |
|---|---|
| bits written to | data written |
| storage bits 224 | data word, bits 0-11 |
| storage bits 226 | alternate bits 0-11 |
| storage bits 228 | data word, bits 12-127 |

Thus, the swap mode permits "user-specified" data to be written to the storage bits 224. This data is considered to be user-specified since it originates from bits 1-11 of the data word, and the data word is selected by the user. As mentioned above, the alternate bits are calculated by the alternate bit generator of the EDC circuit 200. The alternate bit generator 203 includes an arrangement of parity trees. These parity trees calculate 12 bits of data which, when considered with the 116 data bits in the storage bits 228, form a data word for which the contents of the storage bits 224 provide a corresponding set of check bits. In other words, the 12 alternate bits are selected so that if the 12 alternate bits and bits 12-127 of the data word were to be input into the EDC circuit 200 as a data word, the resultant check bits calculated by the check bit generator 201 would be identical to the user-specified data currently in the storage bits 224.

Thus, whether the normal or swap mode is selected, the data in the storage bits 228 and 226 and the data in the storage bits 224 form a valid code word. Accordingly, a user-specified 12 bit value can be placed in the storage bits 224 simply by (1) placing the desired 12 bits on the CPU bus 208 in the position of bits 1-11, and (2) selecting the swap mode by placing a high signal on the select input line 221.

General Description—Read Circuitry

Referring to FIG. 3, the read circuitry of the invention, like the write circuitry, operates in either a normal or a swap mode. In either mode, data from the storage bits 228, 226, and 224 is received from the memory 206 and directed to the error detecting circuit 302; the data from the storage bits 228 is also directed to the error correcting circuit 304. In the normal mode, the data of the storage bits 226 is supplied to the error correction circuit 304. The data read from storage bits 228 and 226 is corrected if necessary, and output as a single data word on the CPU bus 208.

In the swap mode, data from the storage bits 224 is supplied to the error correcting circuit 304. This data and the data from the storage bits 228 are output as a single data word on the CPU bus 208.

Detailed Description—Read Circuitry

In both normal and swap modes, the error detecting circuit 302 receives data from the storage bits 228, 226, and 224, via the buses 314, 315, and 316. This data is interpreted by the error detecting circuit 302 as being a code word comprising a data word (received from the storage bits 228 and 226) and a set of check bits (received from the storage bits 224). The error detecting circuit 302 employs a parity tree arrangement to determine whether the bits received on bus 316 properly correspond to the data word present on the buses 314 and 315. The use of parity trees for such an error detecting function is sufficiently well known in the art that an ordinarily skilled artisan, equipped with this specification, would be able to design an arrangement of parity trees suitable for the present invention. If an error is detected, the circuit 302 generates a specialized signal and places the signal on the bus 318. Such specialized signals, called "syndromes, are utilized in the normal mode by the error correcting circuit 304 to correct the error detected by the circuit 302.

The circuit 304 receives data from the buses 310 and 312, corrects the data under some circumstances, and places the data upon the CPU bus 208. Generally, the third multiplexer 300 determines whether the bus 310 will contain the contents of storage bits 224 or 226. If the swap mode was used to write the data to the memory 206, the select input line 320 of the third multiplexer 300 will be high, and the multiplexer 300 will operate in the swap mode. In this case, since the 12 check bits and bits 1-11 of the data word were "swapped" during the write operation, these bits must be returned to their original positions to provide the CPU bus 208 with the same data word that was originally received from the CPU bus 208. Thus, in the swap mode, the multiplexer 300 places the contents of the storage bits 224 on the bus 310.

In the swap mode, the select input line 320 of the error correcting circuit 304 is high, which causes the error correcting function of the circuit 304 to be disabled. As a result, the error correcting circuit 304 operates as a conduit, passing the data received on buses 312 and 310 to the CPU bus 208 without any error correction. No error correction is performed on "swapped" data for a number of reasons. Since one of the primary functions of the swap mode of the present invention is to test storage bits of the memory 206, it would be undesirable in the swap mode to correct the data read from the memory 206 prior to placing it on the CPU bus 208. If errors introduced into the data word by the memory 206 were to be corrected by the correcting circuit 304 in the swap mode, it would be difficult to determine whether the memory 206 was operating properly. Particularly, any errors caused by the memory would be effectively hidden by the error correction. Also, since the syndromes provided to the error correcting circuit 304 are based upon the manner of storing data in the normal mode, correction of swapped data would require an additional multiplexer, which would introduce delays into the read circuitry. Thus, in the swap mode, the error correcting circuit 304 operates as a conduit, by passing data without error correction.

The multiplexer 300 will operate in the normal mode when a low signal is present on the select input line 320. In this case, since the 12 check bits and bits 1-11 of the data word were not "swapped" during the write operation, the contents of the storage bits 226 are output by the multiplexer 300 on the bus 310. The bus 312 contains bits 12-127 of the data word. In the normal mode, the error correcting circuit 304 receives data from the buses 310 and 312, and, if necessary, corrects this data based upon the syndromes supplied by the bus 318.

The present invention provides a number of advantages over prior arrangements. In particular, the invention is more efficient than some prior arrangements since it does not require status registers to be manually set. Moreover, with the present invention, storage bits in the memory 206 can be directly tested without disabling the error detecting circuit 200. In particular, the testing can be performed simply by specifying the desired data word bits and selecting a swap mode. Furthermore, lengthy, laborious, and time-consuming calculations are not necessary to provide desired signals to the storage bits of memory 206 normally associated with the check bits. Also, since the operation of the third multiplexer 300 occurs simultaneously with the error detecting operation of the error detecting circuit 302, the invention does not require any additional time to read the memory 206.

While there have been shown what are presently considered to be preferred embodiments of the invention, it will be apparent to those skilled in the art that various changes and modifications can be made herein without departing from the scope of the invention as defined by the appended claims.

What is claimed is:

1. A method of reading data bits from a computer memory for testing the memory, comprising the steps of:
   receiving from a computer memory a set of check bits and a multi-bit data word having a first group of bits and a second group of bits;
   detecting errors in the multi-bit data word;
   generating an error-indicating syndrome in accordance with the detected errors;
   providing an output bus with an output signal, wherein if a swap operational mode has been selected the output signal comprises the check bits and the first group of bits, and wherein if a normal operational mode has been selected the output signal comprises the multi-bit data word.

2. The method of claim 1, wherein, if the normal operational mode has been selected, the multi-bit data word is corrected in accordance with the syndrome prior to the step of providing the output signal.

3. The method of claim 1, wherein the steps of detecting errors and generating syndromes occur concurrently with the step of providing the output signal.

4. The method of claim 1, further comprising a step of comparing the output signal to a second multi-bit data word.

5. The method of claim 1, wherein the step of generating an error-indicating syndrome comprises a step of generating multiple error-indicating syndromes in accordance with the detected errors.

6. A method of writing data bits in a computer memory for testing the memory, comprising the steps of:
receiving a multi-bit data word comprising a first group of bits and a second group of bits;
writing the first group of bits to first storage bits in the memory;
in a normal operational mode:
writing the second group of bits to second storage bits in the memory;
generating a first set of check bits based upon the multi-bit data word, said first set of check bits being equal in number to the second group of bits; and
writing the first set of check bits to third storage bits in memory; and
in a swap operational mode:
writing the second group of bits to the third storage bits in place of the first set of check bits;
selecting a set of alternate bits which if combined with the first group of bits in the normal operational mode, would generate a second set of check bits identical to the second group of bits; and
writing the selected set of alternate bits to the second storage bits.

7. The method of claim 6 wherein the normal operational mode additionally comprises steps of recalling from the memory the contents of the first storage bits and the second storage bits and comparing said recalled contents to the multi-bit data word.

8. The method of claim 6 wherein the swap operational mode additionally comprises steps of recalling from the memory the contents of the first storage bits and the third storage bits and comparing said recalled contents to the multi-bit data word.

9. An apparatus for testing computer memory, comprising:
a check bit generator to generate a set of check bits based upon a multi-bit data word according to a predetermined routine, the multi-bit data word including a first group of bits and a second group of bits, wherein the second group of bits is equal in number to the check bits;
a bus to provide the first group of bits to first storage bits in the memory;
a first multiplexer operable in a normal mode to write the second group of bits to second storage bits of the memory, and in a swap mode to write a set of alternate bits to the second storage bits;
a second multiplexer operable in a normal mode during the normal mode of the first multiplexer to write the set of check bits to third storage bits of the memory, and in a swap mode during the swap mode of the first multiplexer to write the second group of bits to the third storage bits.

10. The apparatus of claim 9, further comprising an alternate bit generator to calculate the alternate bits.

11. An apparatus for testing computer memory, comprising:
an error detecting circuit to receive a multi-bit data word and a set of check bits from memory, to detect errors in the multi-bit data word and the set of check bits, and to provide a syndrome signal indicative of said errors, said multi-bit data word having a first group of bits and a second group of bits, wherein the second group of bits is equal in number to the check bits;
a multiplexer coupled to the error detecting circuit, said multiplexer being operable in a normal mode to provide an output signal comprising the second group of bits, and in a swap mode to provide an output signal comprising the set of check bits; and
a bus coupled to the error detecting circuit to provide an output signal comprising the first group of bits.

12. The apparatus of claim 11, further comprising:
an error correcting circuit, to receive the syndrome signal from the error detecting circuit and to provide an output signal including the multiplexer output signal and the bus output signal.

13. The apparatus of claim 11, further comprising:
an error correcting circuit, receiving the syndrome signal from the error detecting circuit, and operable in a normal mode during the normal mode of the multiplexer to correct the first and second groups of bits in accordance with the syndrome signal and provide an output including the corrected bits.

* * * * *